(12) United States Patent
Donaher et al.

(10) Patent No.: US 11,353,800 B2
(45) Date of Patent: Jun. 7, 2022

(54) CONFORMAL STAGE

(71) Applicant: Onto Innovation, Inc., Wilmington, MA (US)

(72) Inventors: J. Casey Donaher, Westford, MA (US); Edward J. Ficarra, East Hampstead, NH (US); Christopher J. McLaughlin, Minneapolis, MN (US)

(73) Assignee: Onto Innovation Inc., Wilmington, MA (US)

(*) Notice: Subject to any disclaimer, the term of this patent is extended or adjusted under 35 U.S.C. 154(b) by 0 days.

(21) Appl. No.: 16/956,617

(22) PCT Filed: Dec. 21, 2018

(86) PCT No.: PCT/US2018/066991
§ 371 (c)(1),
(2) Date: Jun. 22, 2020

(87) PCT Pub. No.: WO2019/133457
PCT Pub. Date: Jul. 4, 2019

(65) Prior Publication Data
US 2020/0401055 A1 Dec. 24, 2020

Related U.S. Application Data

(60) Provisional application No. 62/611,200, filed on Dec. 28, 2017.

(51) Int. Cl.
*G03F 7/20* (2006.01)
*H01L 21/683* (2006.01)
*H01L 21/687* (2006.01)

(52) U.S. Cl.
CPC ...... *G03F 7/70716* (2013.01); *G03F 7/70708* (2013.01); *H01L 21/687* (2013.01); *H01L 21/6833* (2013.01); *G03F 7/703* (2013.01)

(58) Field of Classification Search
CPC ............ G03F 7/70716; G03F 7/70708; H01L 21/6833; H01L 21/687
(Continued)

(56) References Cited

U.S. PATENT DOCUMENTS 5,563,684 A * 10/1996 Stagaman .............. G03B 27/58
355/47
5,828,142 A 10/1998 Simpson
(Continued)

FOREIGN PATENT DOCUMENTS

| CN | 110018617 A | 7/2019 |
|---|---|---|
| TW | 201939170 A | 10/2019 |
| WO | WO-2019133457 A1 | 7/2019 |

OTHER PUBLICATIONS

International Search Report and Written Opinion dated Mar. 29, 2019, in connection with International Patent Application No. PCT/US2018/066991, filed Dec. 21, 2018, 15 pgs.
(Continued)

*Primary Examiner* — Hung Nguyen
(74) *Attorney, Agent, or Firm* — Schwegman Lundberg & Woessner, P.A.

(57) ABSTRACT

An improved stage for the processing of large, thin substrates, such as glass and semiconductor panels. Processing includes lithography, inspection, metrology, grinding, and the like. The stage includes a chuck that moves over a base relative to a device for processing a substrate. The chuck conforms to a geometry of the base while moving relative to the base.

28 Claims, 7 Drawing Sheets

(58) Field of Classification Search
USPC .................................................. 355/72–76
See application file for complete search history.

(56) References Cited

U.S. PATENT DOCUMENTS

| | | | |
|---|---|---|---|
| 7,385,671 | B2 | 6/2008 | Gardner et al. |
| 2004/0025322 | A1 | 2/2004 | Binnard |
| 2005/0185166 | A1* | 8/2005 | Miyajima ............... G03F 7/707 355/75 |
| 2009/0233234 | A1* | 9/2009 | Shibazaki ........... G03F 7/70816 430/296 |
| 2009/0315413 | A1 | 12/2009 | Iwatani et al. |
| 2012/0015461 | A1* | 1/2012 | Donaher ............... G03F 7/7085 438/16 |
| 2013/0321974 | A1 | 12/2013 | Kuribayashi |
| 2014/0084423 | A1 | 3/2014 | Priewasser |
| 2017/0125278 | A1* | 5/2017 | Jin .................... H01L 21/68785 |
| 2018/0129144 | A1* | 5/2018 | Ueda ..................... G03F 9/7003 |

OTHER PUBLICATIONS

"International Application Serial No. PCT/US2018/066991, International Preliminary Report on Patentability dated Jul. 9, 2020", 11 pgs.

* cited by examiner

CONFORMAL STAGE

CROSS-REFERENCE TO RELATED APPLICATIONS

This application is a national stage under 35 U.S.C. § 371 of International Patent Application No. PCT/US2018/066991, filed Dec. 21, 2018, which claims the benefit of U.S. Provisional Application No. 62/611,200, filed Dec. 28, 2017, the disclosures of which are incorporated herein by reference in their entirety.

TECHNICAL FIELD OF THE INVENTION

The present invention relates generally to an improved planar stage for the support and handling of large panels used in semiconductor and related manufacturing.

BACKGROUND OF THE INVENTION

A stage for lithography and other substrate processing activities are typically built to the scale of the substrate being processed. Where the substrates are very large, the stage will also be quite large. Stages used to perform lithography and other process steps on LCD and other panels are a good example. These stages are sized to handle panels specified in "generations" having nominal sizes as follows:

| Generation | Size (mm) |
| --- | --- |
| Gen. 1 | 300 × 400 |
| Gen. 2 | 360 × 465 |
| Gen. 2.5 | 400 × 500 |
| Gen. 3 | 550 × 650 |
| Gen. 3.5 | 620 × 750 |
| Gen. 4 | 730 × 920 |
| Gen. 5 | 1100 × 1300 |
| Gen. 6 | 1500 × 1850 |
| Gen. 7 | 1870 × 2200 |
| Gen. 7.5 | 1950 × 2200 |
| Gen. 8 | 2200 × 2500 |

Stages must be capable of moving such large substrates relative to a projector camera or other processing tool to be effective. Where a single processing tool is addressed to a substrate the stage will have dimensions that are on the order of slightly larger than twice the dimensions of the substrate. Planar stages of a type described in U.S. Pat. No. 5,828,142 are particularly well-suited to support and translate large substrates such as, for example, Gen.6 panels for LCD televisions and advanced packaging operations.

Processing of large substrates, or any substrates, in the semiconductor or other similar industry require a high degree of precision. This degree of precision is relatively easy to achieve where the substrates and stage that carry them are moderately sized, e.g. geared towards 200-300 mm silicon wafers. Where the stages are scaled up to accommodate Gen.6 or even larger substrates, maintaining a high degree of precision can be difficult. Accordingly, there is a need for ensuring that processing of large substrates can be conducted in a reliable manner.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
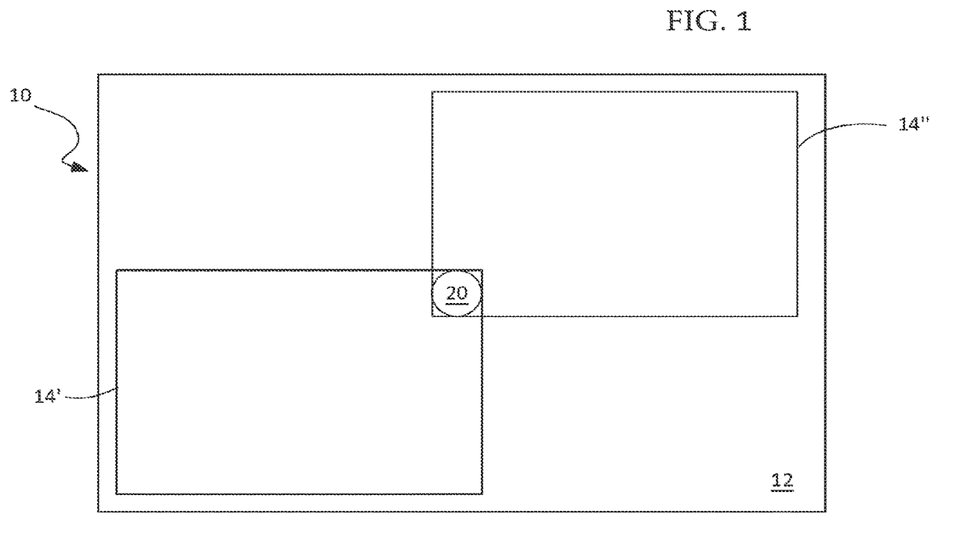
FIG. 1 is a schematic representation of how a single projection camera is addressed to a large substrate for exposure of the entire substrate.

FIG. 1 is a schematic representation of a planar stage 10 for moving a large panel type substrate relative to a processing tool that is in this case a projection camera 20. Note that a projection camera 20 used for lithographic exposure is only one of the possible uses for the present invention. In addition, an optical inspection device, a transparent film metrology device, an opaque film metrology device, a 3D height sensor, or a profilometer may be used in place of the illustrated projection camera 20. These devices may operate at any suitable wavelength. Note that for purposes of exposition, the substrate and the chuck 14 are represented as a single rectangular element in this Figure and in FIG. 2. The base 12 of the stage 10 is large enough to accommodate a chuck 14 that supports the substrate, among other things. The base 12 is large enough to allow the chuck 14 to move between positions 14' and 14". This range of movement allows all portions of the substrate to be addressed by the projection camera 20. Note that in this example, the base 12 is in the range of twice the lateral dimensions of the chuck 14, which is in turn sized to support a substrate and the requisite motive power and positioning structures.

Figure 2:
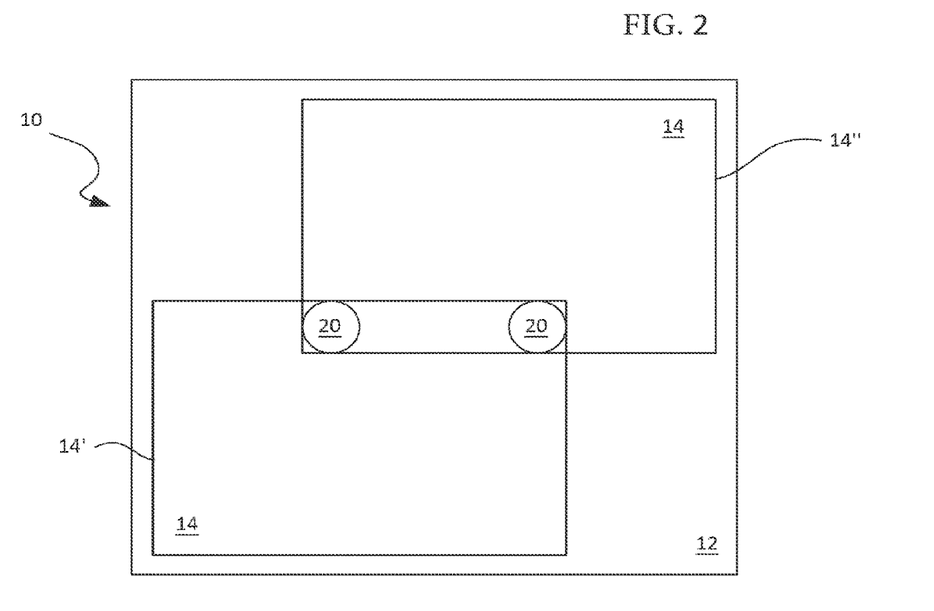
FIG. 2 is a schematic representation of how two projection cameras are addressed to a large substrate for exposure of the entire substrate.

FIG. 2 is a schematic representation of a large planar stage 10 that is arranged to move a substrate S relative to two projection cameras 20 as described in U.S. Pat. No. 7,385,671 to Gardner, et al., the disclosure of which is hereby incorporated by reference. Because there are two process tools in the form of projection cameras 20, each of which may address one half of the substrate S at the same time, the extent of the planar stage 10 may be made smaller than where only a single process tool 20 must address the entire substrate.

The planar stage represented in FIGS. 1 and 2 generally includes a planar base 12 on which a planar chuck 14 travels. The chuck 14 is supported above the base 12 on a cushion of air and is moved in the XY plane defined by the surface of the base 12 by a planar or Sawyer motor (the components of which are omitted for clarity's sake). FIGS. 1 and 2 show how a chuck 14 can be moved laterally over the base 12 to address an entire substrate S to a pair of process tools, in this instance, projection cameras 20. Ideally, it would be easy to form a perfectly planar base 12 and chuck 14 such that a substrate S would be translated relative to projection cameras 20 in an XY plane perpendicular to an optical axis 22 of the projection cameras 20. See FIGS. 3 and 4. As a projection camera 20 has a depth of field of limited dimension along the optical axis 22, it is important that the substrate S be maintained within this limited range.

Figure 3:
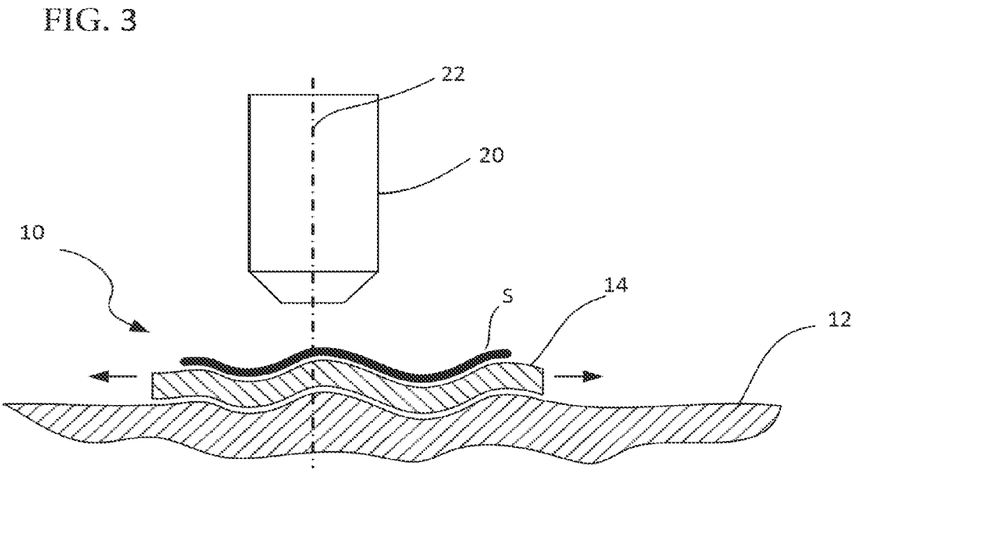
FIG. 3 is a schematic illustration of an out of flat stage relative to a projection camera.

In reality, planar stages 10 tend to have variation in their working surfaces that can make it difficult to maintain the desired dimensional precision. Indeed, the effort and expense of ensuring that an entire stage 10 with lateral dimensions that may exceed 4 m is perfectly flat are orders of magnitude higher than for smaller stages. FIG. 3 illustrates the basic problem. A projection camera 20 having an optical axis 22 is directed toward a substrate S on a chuck 14. The optical axis 22 is nominally perpendicular to the substrate S but in reality out of plane deformations or deviations make this difficult to obtain. The fact is that a base 12 tends to have deformations in its surface. And, as the chuck 14 is somewhat compliant, the deviations from a plane in the base 12 are reflected in the chuck 14. This, in turn, results in a non-flat substrate S being presented to the projection camera 20. This non-flat substrate may fall outside the depth of field of the projection camera 20. The present invention addresses the problem of a non-flat substrate S and sidesteps a significant portion of the trouble and expense involved in flattening the base 12 of the stage 10.

Figure 4:
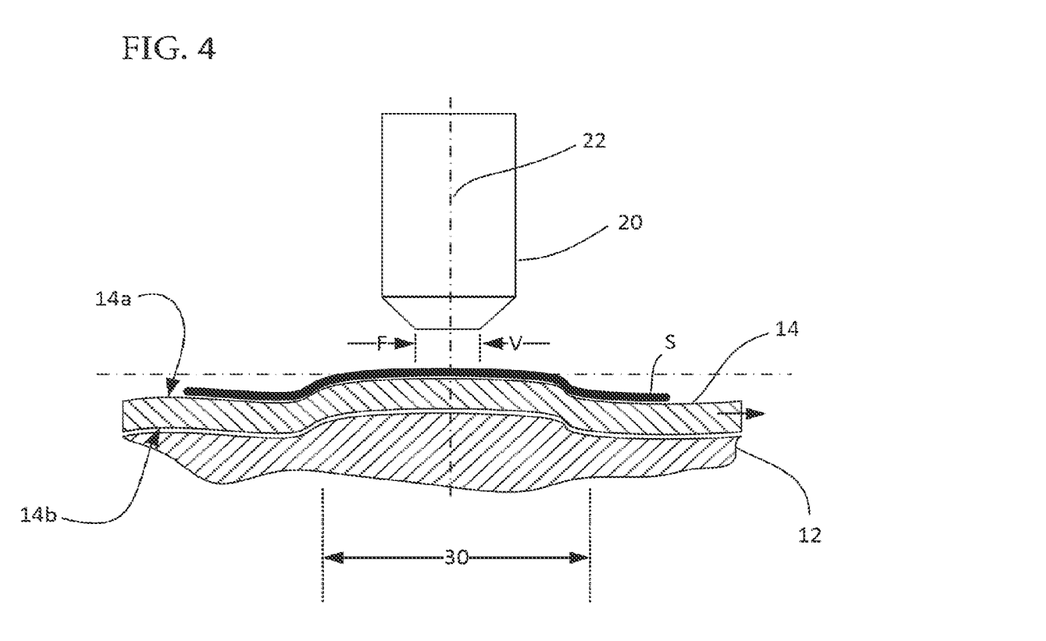
FIG. 4 is an illustration of a stage in which a subregion of the base to which the projection camera is addressed is flat.

The present invention takes advantage of the compliance in the chuck 14 to ensure flatness in the stage 10 where it is needed most: under the one or more projection cameras 20. FIG. 4 illustrates one example of an improved stage 10 according to the present invention. Chuck 14 is a planar structure having an upper surface 14a and a lower surface 14b. The structure that exists between the surfaces 14a and 14b will vary from application to application. Some common items included in the chuck 14 are 'forcer' or driver units for driving the chuck 14 relative to the base 12, i.e. in an XY plane, as is understood to those familiar with Sawyer type motors, air bearing pucks or units for supporting the chuck 14 above the base 12, and structures for clamping a substrate S to the upper surface 14a of the chuck 14. The structures or means for clamping a substrate S to the chuck 14 are preferably pneumatic, i.e. vacuum based, though mechanical or electrostatic means may be used in lieu of or in addition to pneumatic mechanisms. Note that the foregoing features have been omitted from the Figures for the sake of clarity.

Figure 8:
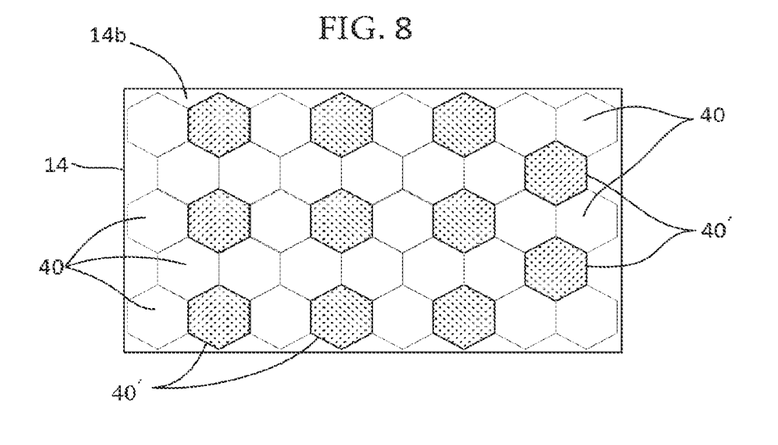
FIG. 8 illustrates a chuck having substantially its entire reverse surface covered in air bearing pucks.
Figure 9:
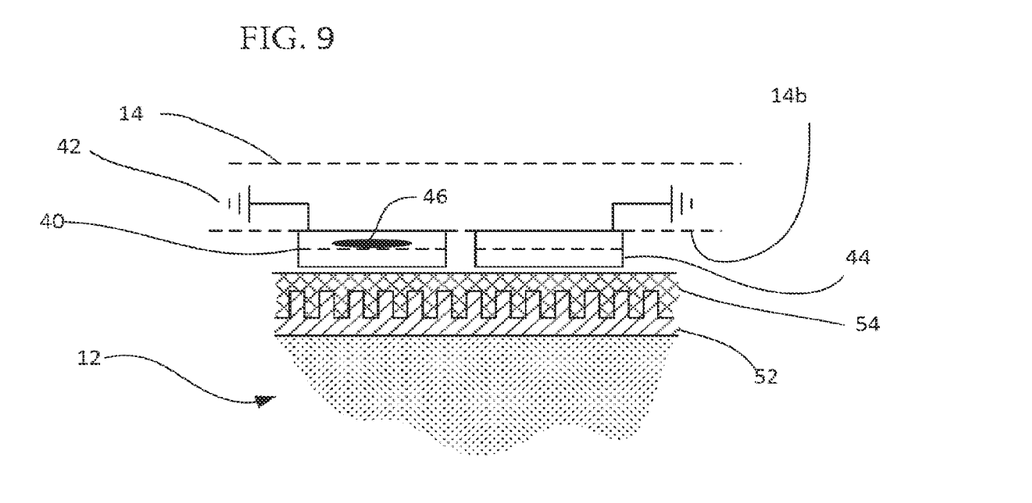
FIG. 9 is a schematic cross section of a pair of air bearing pucks supporting a chuck over a base.

Chuck 14 is subject to a number of loads, chief among these being its weight. Additional weight loads from forcer units, the substrate S itself, pneumatic fittings, etc., are also imposed. The chuck 14 is supported above the base 12 by a number of air bearing mechanisms schematically represented in FIGS. 6-9. These can involve the provision of individual nozzles where ports on the lower surface 14b of the chuck 14 emit air under positive pressure at a volume sufficient to lift the chuck 14 above the base 12. Preferably, these ports or nozzles will be distributed to impart a uniform lifting force against the chuck 14. The lifting force may also be applied to the chuck 14 by a plurality of air bearing "pucks" 40 affixed to the lower surface 14b of the chuck 14. As seen in FIG. 9, the pucks 40 generally have a single inlet 42 (though more may be provided) that is plumbed to distribute air under positive pressure to nozzles or ports. The puck 40 may also define an optional plenum chamber 44 into which the air is emitted to create lift. This arrangement is well known to those skilled in the art.

In addition to air bearings and/or integral air nozzles on the lower surface 14b of the chuck 14, structures that actively counteract the lifting force applied by positive air pressure may be employed. The idea here is that the lifting force of an air bearing 40 is at least partially overcome by a downforce. The purpose of the downforce is to ensure that the action of the air bearings 40 results in a uniform and substantially constant distance between the base 12 and the chuck 14 during operation. A downforce may be induced by an air bearing puck 40' that draws a vacuum through its inlet 42 instead of emitting air under positive pressure. In another embodiment, a magnet 46 may be installed in each air bearing puck or in selected locales on or in the lower surface 14b of the chuck 14. See FIG. 9. Magnets 46 interact with the metallic structure of the base 12 to 'pre-load' the air bearings of the chuck 14, which tends to keep the operation of the air bearings within a preferred performance envelope, i.e. keeps the chuck 14 at a pre-determined position above the base 12. This pre-loading also has the additional benefit of increasing the compliance of the chuck 14 with respect to the base 12. As will be appreciated, the chuck 14 is formed with some in built elasticity to permit the chuck to conform to the base 12. The goal of all of these structures and those described below is to present a substrate S to one or more projector cameras 20 in a manner in which the obverse side of the substrate is within a depth of field of the projector camera 20.

Figure 7:
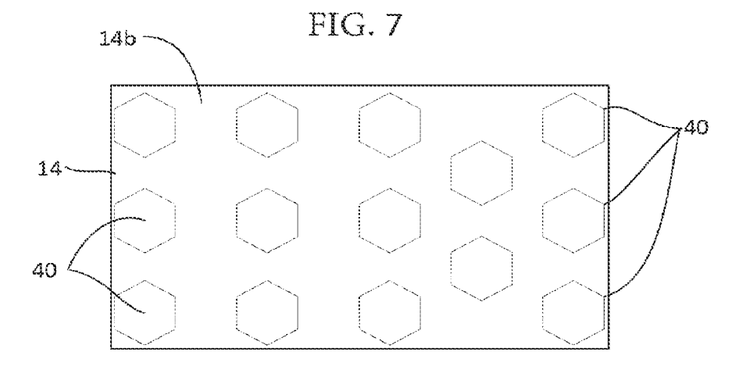
FIG. 7 illustrates a chuck having relatively large air bearing pucks distributed over a reverse surface.

FIG. 7 illustrates a distribution of air bearing pucks 40 across the lower surface 14b of a chuck 14. The distribution is intended to be generally uniform, but may vary if structures of the chuck 14 obstruct the placement of the puck 40. Some pucks 40' may optionally be magnetic or use negative pressure (vacuum) to pre-load the chuck 14. FIG. 8 illustrates how larger pucks 40 may be tiled to achieve lesser or greater coverage of the lower surface 14b of the chuck 14. FIG. 9 is a schematic cross section of two common types of puck 40, among other things. Each puck 40 is connected to a pressure supply or inlet 42 (positive or negative). The pucks 40 are shown with a plenum chamber 44, which is a region bounded at its sides by a curtain or wall. This plenum chamber 44 allows the puck 40 to generate more lift or to pull towards the base 12 harder. A plenum chamber 44 is optional. The puck 40 on the left is seen to include a magnet 46 which is used to pre-load the puck, pulling downward toward the base 12 whilst positive air pressure in the plenum chamber 44 pushes the puck 40 and chuck 14 away from the base. Pressure may be emitted directly (positive or negative) directly from the puck 40 without the presence of a plenum chamber. FIG. 9 also illustrates schematically a cross section of the base 12.

FIGS. 3 and 4 are schematic in nature and show an exaggerated degree of non-flatness in the base 12 and the chuck 14. The magnitude of unflatness in the base 12 is generally less than 1.0 mm over more than a meter, however this is inadequate for most lithographic purposes. The purpose of the present invention is to ensure that regions of the base 12 that require flatness are flat irrespective of the non-flat nature of the remainder of the base 12. As suggested above, this is accomplished by taking advantage of the compliance of the chuck 14. As also suggested above, the chuck 14 includes various structures and mechanisms for carrying out operations on a substrate S that is secured thereto. In an environment such as semiconductor processing, where accuracy and repeatability are of extreme importance, the chuck 14 is required to be mechanically stiff enough to ensure that its operations meet all applicable specifications. This requirement is offset by the need to ensure that the chuck 14 is sufficiently compliant to conform to a shape of the base 12. In general then, the chuck 14 will be characterized by a certain mechanical stiffness in the XY plane and a certain compliance characterized by rotations of the chuck 14 around the XY axes. Further, the chuck 14 will deflect in the Z direction perpendicular to the XY plane. The chuck 14 maintains dimensional fidelity in the XY plane such that any deformation within the XY plane is small enough to not affect the alignment of a project camera 20 with a device or structure being formed on a substrate S.

The chuck 14 should also be rigid enough to avoid the problem of deforming under a point load. For example, forcers used to provide motive power to the chuck 14 as part of a Sawyer type flat motor system may be heavy enough to deform the chuck 14 at the locale of the forcer. It is preferable that the gap between the chuck 14 and the base 12 created by the air bearing arrangement be as uniform as possible. Not only will this ensure that the chuck will conform to the shape of the base 12 in a predictable manner, but avoids the problem of unintended contact between the chuck 14 and the base 12 as the chuck 14 moves relative to the base 12. Where the chuck 14 is made compliant enough to reliably conform to the shape of the base 12, the number and arrangement of air bearing pucks 40 will be such that point or regional loads are sufficiently supported to ensure significant uniformity in the distance between the base 12 and chuck 14 during operation. One skilled in the art will appreciate that these requirements may be met by fashioning a chuck 14 of materials including, but not limited to, carbon fiber, glass fiber, printed thermoplastics, steel, and aluminum.

Figure 5:
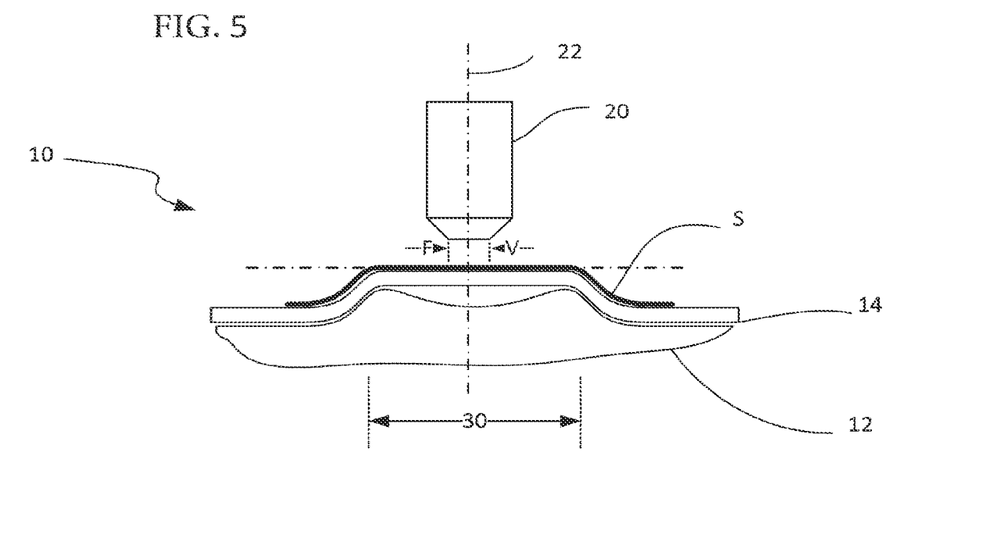
FIG. 5 is an illustration of a stage in which a subregion of the base to which the projection camera is addressed has a non-flat shape.
Figure 6:
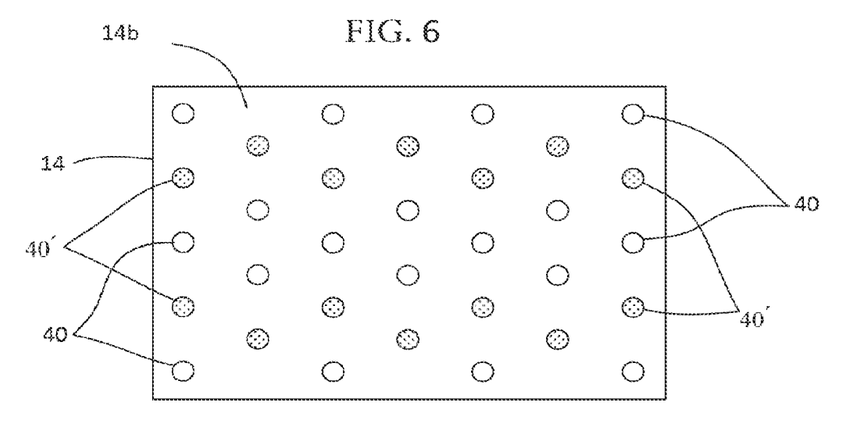
FIG. 6 illustrates a chuck having small air bearing pucks distributed over a reverse surface.

FIG. 4 illustrates how a base 12 may be modified to ensure flatness of the chuck 14 and a substrate S secured thereto within a field of view of a projection camera 20. As can be seen in FIG. 4, projection camera 20 is positioned above a subregion 30 of the base 12 which has a geometry that is complementary with the structure of the chuck 14 such that the chuck 14 and the substrate S secured thereto have a predetermined shape where the optical axis 22 of the projection cameras 20 intersects the substrate S. A substrate S will typically be secured to the upper surface of the chuck 14 by means of pneumatic or electrostatic structures formed into or applied to the upper surface of the chuck 14. In some embodiments, small holes or ports are formed into the upper surface of the chuck 14 and are directed to the reverse side of the substrate. The small holes or ports may also be ring or linear channels formed into the upper surface of the chuck 14. The holes, ports, rings or channels are in fluidic communication with a source of low or vacuum pressure which, when applied, causes the substrate S to be secured to the chuck 14 so long as the low or vacuum pressure is applied. Similarly, in lieu of pneumatic structures such as the foregoing, electrostatic holding mechanisms of a type known to those skilled in the art may be used to secure the substrate S to the chuck 14. The pneumatic or electrostatic structures may be formed integral to the chuck 14 or may be adhered or otherwise secured to the top surface of the chuck 14.

Where the chuck 14 is sufficiently compliant with the base 12 and the subregions 30 thereof, the subregions 30 have a geometry that is simply flat and perpendicular to the optical axes 22 of the projection cameras 20. Note that where more than one projection camera 20 is provided, one or more subregions 30 may be provided. In some embodiments, one subregion 30 will act to support the chuck 14 beneath multiple projection cameras 20. In other embodiments, an individual subregion 30 is provided for each projection camera 20. In all cases, the substrate S will also be flat and perpendicular to the optical axes 22 of the one or more projection cameras 20. Where the chuck 14 has a lower compliance, the geometry of the subregion 30 may take on a more complex shape as shown in FIG. 5. While FIG. 5 is merely exemplary, the idea is that the stresses and deformations imposed upon the chuck 14 by the subregion 30 will impose sufficient planarity on the substrate S within the field of view of the projection camera 20, that is to say, the chuck 14 and the complex shape of the subregion 30 are complementary and result in a flat substrate S. The spacing between multiple subregions 30 is specified to ensure that the substrate S is flat beneath each projection camera and the spacing will depend largely upon the compliance of the chuck 14. Where there is good compliance the subregions 30 and projection cameras can be relatively close to one another. In other cases, where compliance of the chuck 14 is lower it may be useful to space the subregions 30 apart by 10 or even 20 times a dimension of the respective subregions 30.

The size of the subregion 30 is generally larger than the area of flatness that is required by a process tool or projection camera 20. The exact size is dependent, in part, upon the compliance of the chuck 14 and the geometry of the substrate S on the chuck 14. In other words, if the substrate S is positioned such that the edges of the chuck and substrate are nearly coincident, the subregion 30 will likely have to be bigger to allow the edge of the chuck 14 and the substrate S to come to a flat and perpendicular attitude within the field of view FV of the project camera 20. Stiffness of the chuck 14 will likely cause some lack of conformity where there is a transition of the edge of the chuck 14 over discontinuities in the base 12, i.e. when the edge of the chuck 14 moves across the edge of the subregion 30. The size of the subregion 30 must therefore be larger than the area of required flatness, i.e. the field of view FV of the projection camera 20 and for convenience sake, the subregion 30 is generally going to be between two and ten times the size of the area of desired flatness, which is generally tied to the size of the field of view of the projection camera 20.

The subregion 30 can have a shape that is symmetrical or irregular with respect to the optical axis of the projection camera 20, as required. The subregion 30 is typically larger than the field of view of the projection camera 20. In most instances, the subregion 30 will be generally circular and will have a diameter of between 2 and 10 times the size of the field of view of the projection camera 20. The subregion 30 is also often centered upon or even concentric with the optical axis of the projection cameras, though in some embodiments, a centroid of the subregion 30 will be offset from the optical axis of the projection camera 20. In some cases, the subregion 30 will be generally oblong, having a major and a minor axis. The major axis of the subregion 30 will in some instances be between two and ten times the length of the minor axis. In some cases, the major axis will be approximately 4 times the length of the minor axis. The subregion 30 can also be shaped as a generally linear or rectangular strip. In some embodiments, a generally linear/rectangular subregion 30 will extend across or substantially across the entire width of a base 12. Such a strip will have a width of between 2 and 10 times the size of the field of view of the projection camera. In all cases, the dimension of the subregion 30 along an axis of travel of the chuck 14 is large enough to allow the chuck 14 to conform sufficiently to the shape of the subregion 30 so as to offer up a substrate S to the projection camera 20 with the surface of the substrate S being substantially within the depth of field of the projection camera 20.

Note that the height of the subregion 30 too will vary depending on the compliance of the chuck 14 and also based on the nominal flatness of the base 12. Where a base 12 is, at baseline, relatively flat, the height of the subregion 30 is likely to be lower. Similarly, where the compliance of the chuck 14 is low (i.e. the chuck 14 is relatively stiff), the height of the subregion 30 will be relatively lower. Higher nominal unflatness and/or lower compliance in the chuck 14 may militate in favor of a higher subregion 30 relative to the surface of the base 12 surrounding the subregion 30. Setting a correct height of the subregion 30 eases the transition of the chuck and avoids imposing irregular deformations or shapes on the chuck 14. This principle will apply whether the surface of the subregion 30 is above or below the nominal upper surface of the remainder of the base 12.

Where a stage 10 is relatively small, it is often made in a single unit. For example, a base 12 may be built up from a single granite or composite stone monolith upon which is mounted the tiles 52 of a stator of a flat motor. See FIGS. 9 and 10. The upper surface of the tiles 52 is then covered and encapsulated in an epoxy or another hard, non-conductive potting material 54 over which the chuck 14 will move. The upper surface of the material 54 is then flattened using standard surfacing techniques known to those skilled in the art such as grinding. This process is time consuming and therefore expensive. The larger the base 12, the higher the expense. Resulting bases 12 are then moved and installed in the standard manner.

Where the base 12 becomes too large to move around or handle in one piece, the base 12 will be made in components 50 (see FIG. 10) that are secured together at the time of installation. This means that the already expensive machining techniques will become extremely difficult to carry out as even if the base 12 can be made perfectly flat during manufacture, the base will then be disassembled for transport and reassembly. This process, even if undertaken with extreme care, will often result in a non-flat surface. Transporting and employing typical machinery and personnel to the field to re-flatten such a surface is prohibitive.

The formation of a subregion 30 on a base 12 that obviates the problem of an overall lack of flatness of the base allows for the inexpensive manufacture of much larger bases 12. Further, the formation of a generally smaller subregion 30 is much easier to accomplish in the field. One of the key aspects of a suitable subregion 30 is that it will be formed in such a manner as to decouple the non-flat regions of the base 12 from the areas that are required to be flat, i.e. the area beneath a projection camera 20.

In one embodiment, the desired location of the subregion 30 is identified from the location of a processing tool such as a projection camera 20. In other cases, a suitable location for the subregion may be determined and the processing tool will be positioned accordingly, though this is generally rarer. The surface of the base 12 within the subregion 30 is then machined, ground, or ablated to form at least a central area that is flat and perpendicular to the projection camera 20. The transition zone of the subregion 30 between the surrounding surface of the base 12 and the central, flat region of the subregion 30 is formed to impose the desired conformality upon the compliant chuck 14 while avoiding sharp transitions that might cause the chuck 14 to contact the base 12 during motion of the chuck 14. Further, the transition zone will be formed to avoid any discontinuities that might give rise to uneven pressures in the air bearings (pre-loaded or otherwise) of the chuck 14 to avoid non-flatness in the chuck 14.

In another embodiment, a subregion 30 is identified and one will find that the central area of subregion 30 is generally close to the desired flatness and size. In this embodiment, the transition zone of the subregion 30 will be worked to decouple the non-flat portions of the base 12 from the generally flat central area of the subregion 30. Of course, the central area of the subregion 30 will be flattened as needed, but in this embodiment, the focus of the effort will be on isolating the already generally flat region from the non-flat regions of the base 12.

Figure 10:
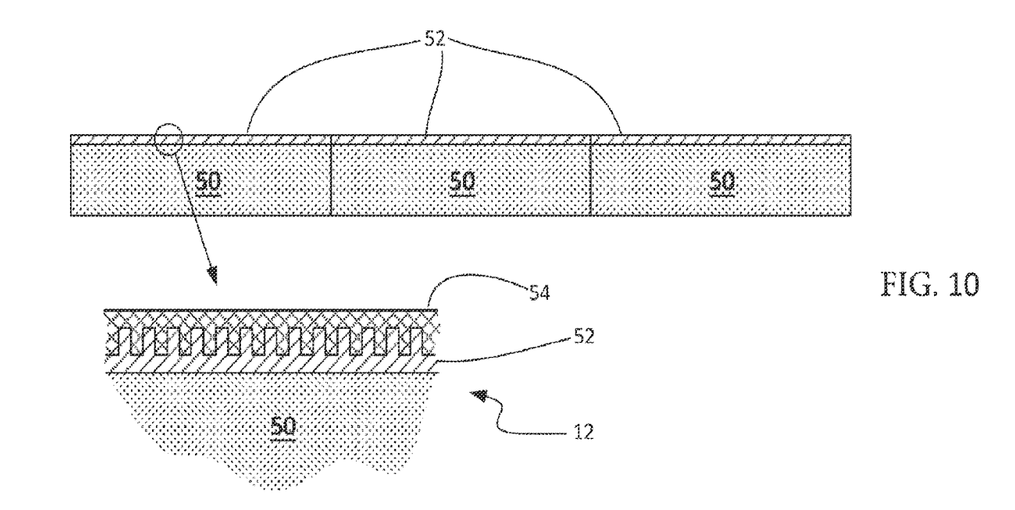
FIG. 10 is a schematic cross section of one embodiment of a base.

FIG. 10 illustrates one embodiment of an ideal base 12 structure that includes a stator of a Sawyer motor. Large monoliths 50, preferably of stone, composite materials, or other materials that have vibration damping and good dimensional stability characteristics are formed into a lower portion of the base 12. The lower portion of the base may rest upon a foundation or stand (not shown). The monoliths 50 are preferably formed as flat as possible so that after they are joined to form a part of the base 12, their upper surface will similarly be flat. Flattening may take place once or multiple times, as needed. Flattening may be done before monoliths 50 are assembled, after they are assembled, or both before and after assembly. The latter option will produce a much flatter surface for the base 12, but is more expensive.

Connecting monoliths together is done using kinematic or mortise/tenon type joints in conjunction with mechanical fasteners and/or adhesives. Where a solid foundation is provided for the monoliths 50, a simple male-female connection to register the monoliths 50 to one another and some suitable adhesive between the monoliths 50 are sufficient to form a unitary base 12. Fasteners may span the joints between respective monoliths 50, may be passed through the entire set or select subsets of monoliths 50 to connect the respective ones together (e.g. tension cables or threaded rods), or may simply fix the monoliths 50 to their foundation (not shown) relative to adjacent monoliths 50. The size of the base 12 is selected to allow the chuck 14 to have a full range of motion relative to one or more projection cameras 20 as seen in FIGS. 1 and 2.

Figure 11:
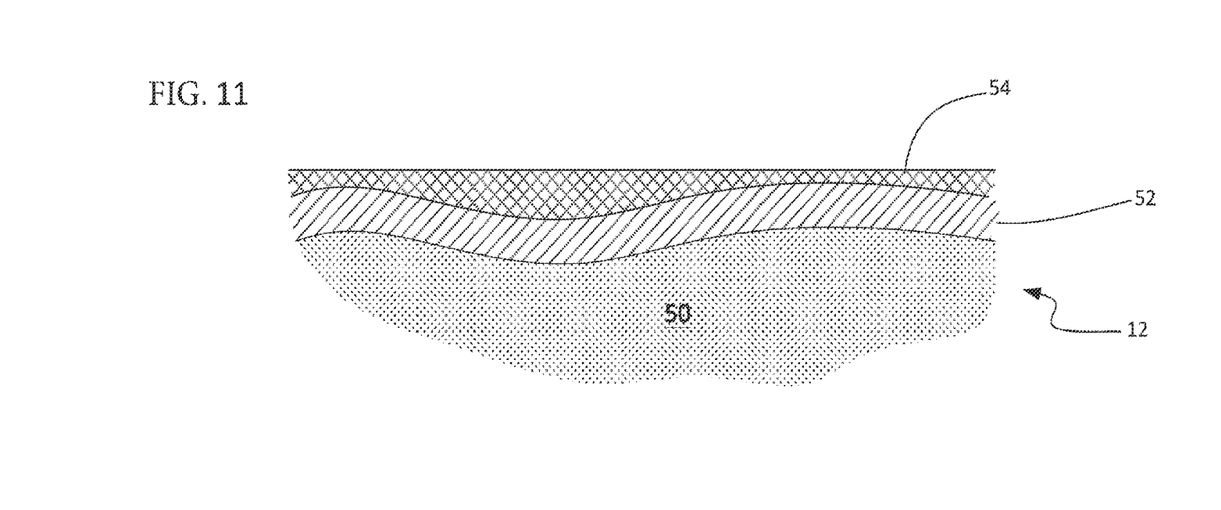
FIG. 11 is a schematic cross section of a base wherein a flat obverse surface is created.

Tiles 52 are formed of a magnetic material and form the stator of a Sawyer type motor. The tiles 52 are generally adhered to the monoliths 50, though fasteners may be used if so desired. Once the tiles 52 are adhered to the monoliths 50, a potting material 54 is applied over the tiles 52. This is done to cover the rough surface of the tiles 52 which often have small teeth or ridges formed into an upper surface thereof. The potting material 54, which is generally an epoxy or other curable material, is ground or lapped flat as seen in FIG. 11. This grinding step obtains a generally flat surface, but it is often difficult to obtain a surface flat to within about 2 microns over 200 mm. This step can be repeated or carried out using tools or techniques that have higher accuracy and precision, however these types of tools and their use are not well suited for use in clean room environments.

A preferred method of ensuring that a base 12 has a suitably flat upper surface once installed in the field starts in a fabrication facility remote from the locale where the system 10 is to be installed. One or more monoliths 50 are emplaced on a suitable foundation or stand, the one or more monoliths forming the finished lateral dimensions of the base 12. Where the monoliths 50 are not yet flat, grinding and lapping operations are performed on the upper surface of the monoliths 50 to ensure flatness. As suggested above, the flatness of the monoliths 50 may or may not meet the final flatness specification required by the projection camera 20 at this time.

Once the monoliths 50 have had their upper surface suitably flattened, tiles 52 are adhered thereto such that substantially the entire upper surface of the monoliths 50 are covered with the tiles 52. Again, the upper surface of the tiles 52 is not perfectly flat due in large part to variations in adhesive thickness. Potting material 54 is poured over the tiles 52 and flattened using grinding or lapping procedures. FIG. 10 illustrates an ideal situation in which the surface of the potting material 54 is parallel to the surface of the tiles 52, which are in turn parallel to the upper surface of the monoliths 50, all of which are substantially flat. One benefit to a final flattening of the potting material 54 is shown in FIG. 11 in which the upper surface of the potting material 54 has been flattened to correct for surface imperfections in the tiles 52 and the monoliths 50.

The embodiments shown in FIGS. 3-5 have the subregion 30 extending above the surrounding surface of the base 12. The subregion 30 may also be formed into and generally below the surface of the surrounding base 12. The depth and the extent of such a concave subregion 30 will be dependent upon the compliance of the chuck 14 and the substrate S and other mechanisms secured thereto. Subregions 30 may be formed in an additive or subtractive process.

Figure 12A:
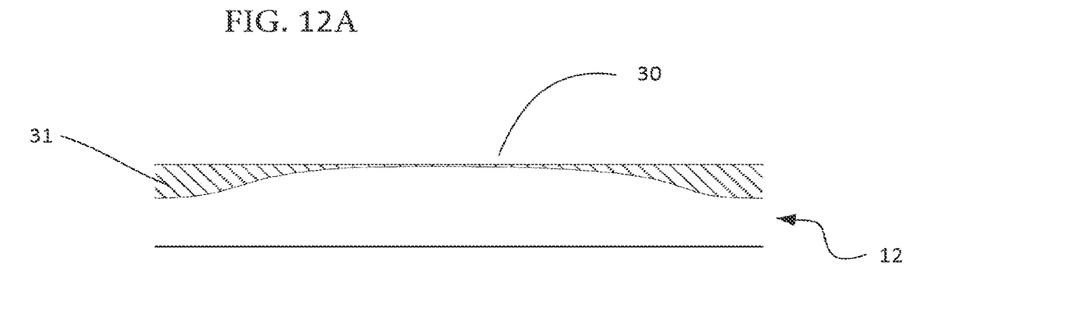
FIG. 12A is one embodiment of a raised subregion of the base.
Figure 12B:
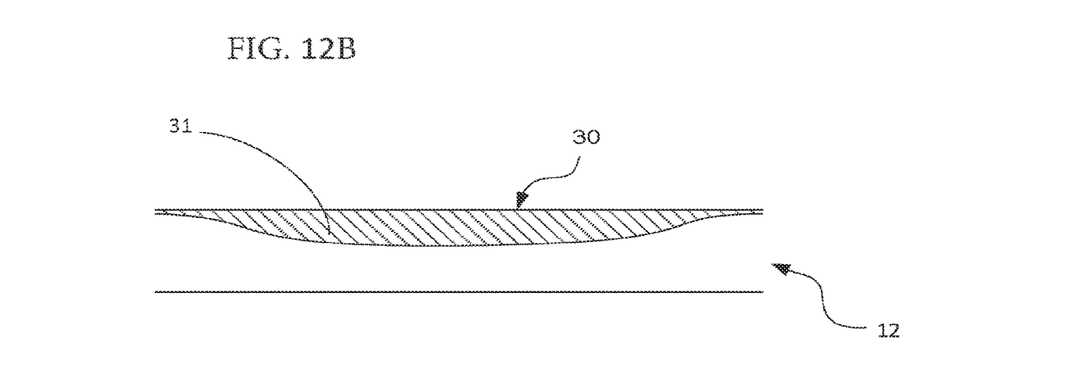
FIG. 12B is an embodiment of a sunken subregion of the base.
Figure 12C:
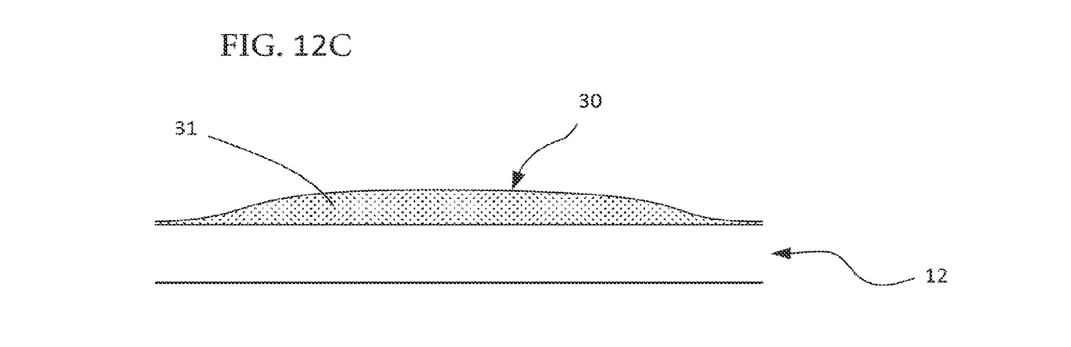
FIG. 12C is an embodiment of a subregion formed on top of the base.

A subregion 30 of the base 12 may be made particularly flat to satisfy the imaging requirements imposed by projection camera 20. This may be done by relieving an area around the selected subregion 30 as seen in FIG. 12A. Material 31 is removed around the subregion 30 and the central portion of the subregion 30 is ground or lapped flat. This results in a subregion 30 that stands proud of (i.e., raised above or higher than) the surrounding surface of the base 12. In other instances, as exemplified by FIG. 12B, it may be desirable to form the subregion 30 in the base 12 by removing material 31 to form a subregion 30 that is lower than the surrounding surface of the base 12. FIG. 12C shows yet another embodiment in which the subregion 30 is formed by building up material 31 to form a subregion that is proud of the surrounding surface of the base 12.

Figure 13:
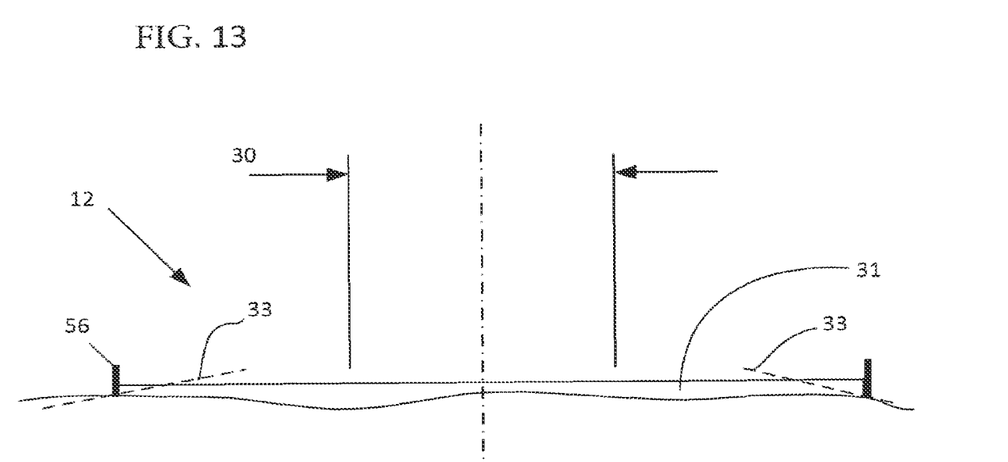
FIG. 13 schematically illustrates one embodiment of how a subregion may be formed on top of a base.

One method of building up the subregion 30 is to place a ring or dam 56 onto the surface of the base 12 that defines the outermost extents of the subregion 30 as seen in FIG. 13. The ring or dam 56 may have an upper edge that is at or a bit above a desired height of the central area of the subregion 30. A moldable material 31 such as an epoxy may then be poured or troweled into the ring or dam and flattened using a screed. Upon removal of the ring, the final flatness of the central area of the subregion 30 is machined flat to within the specifications of the projection camera 20. A transition zone 33 around the subregion 30 is ground down to ease motion of the chuck 14.

Figure 14:
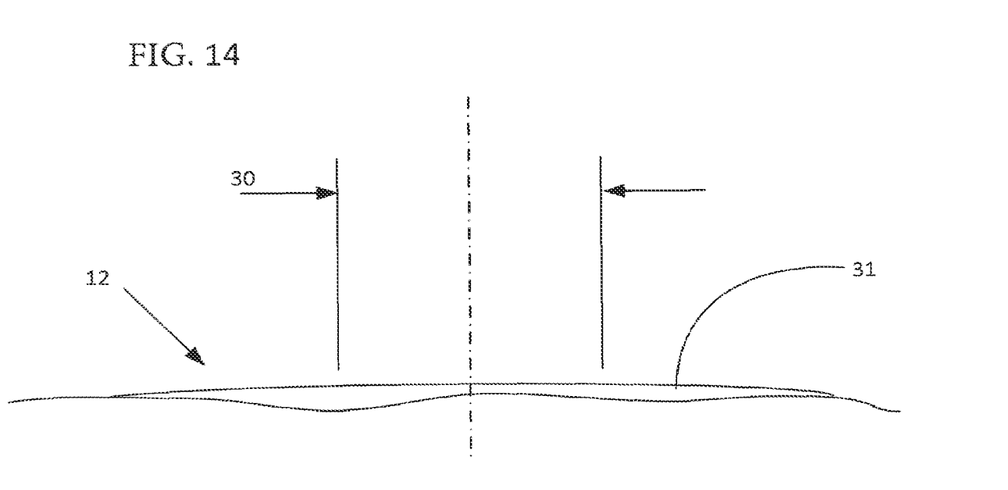
FIG. 14 schematically illustrates another embodiment of how a subregion might be formed on top of a base.

In another embodiment of the present invention, a flowable and curable epoxy or similar material 31 may be poured onto the surface of the base 12 where a subregion 30 is required. See FIG. 14. Instead of a ring or dam 56, the flowable material 31 flows outward until the pressure exerted by the material 31 at its edge is overcome by surface tension and adhesion between the material 31 and the base 12. A general case for the height h of a subregion 30 on the base is given by:

$$h = \sqrt{\frac{2\gamma(1-\cos\theta)}{g\rho}}$$

where $\gamma$ is the surface tension of the epoxy, $\theta$ is the contact angle, $\rho$ is the density and g is the acceleration due to gravity. Using the height h of the material 31 on the subregion 30, one can determine the volume V of the material 31 by specifying a desired radius of the subregion 30 that will be created as follows:

$$V = \pi r^2 h$$

Note that where the flow of material 31 on the base 12 is unconstrained the actual height h and size and shape of the subregion 30 will vary depending on the nature of the base 12 and the potting material 54, among other factors. Where its viscosity, surface tension, and adhesion to the base 12 are low enough, the material 31 will flow out to a relatively uniform shape whose upper surface approximates the curvature of the earth, assuming that the local gravity field represented by g is uniform. The resulting surface may be sufficiently flat without modification except within the transition zone 33. The curvature of the earth is roughly 0.019 microns/m. Where necessary, multiple layers of material 31 may be applied to achieve the correct geometry.

Surface preparation is useful to ensure that there is a good adhesive and mechanical bonding between the epoxy and the base 12. The surface is first cleaned or degreased using a suitable wet or dry cleaning process such as the application of a suitable solvent or the use of carbon dioxide. The surface of the base 12 will be abraded and/or etched to create a good surface having a higher surface energy. A final cleaning or rinse will be conducted to ensure that all foreign materials and debris loosened by the foregoing preparation are removed. This type of preparation creates a higher surface energy in the surface of the base 12 and improves the adhesion of the epoxy. By selecting an epoxy having a suitable surface tension and density and by using a specified volume of epoxy, one can control the size and height of the subregion formed on the base 12.

In a preferred embodiment, a base 12 such as that shown in FIG. 10 is prepared such that its upper surface is relatively planar. The position(s) where a subregion 30 is to be located is identified and cleaned to improve surface energy. A predetermined volume of an epoxy having a predetermined surface tension and density is deposited at the identified location. The epoxy flows under its own weight until it forms a subregion 30 of suitable diameter and height, the surface of the subregion approximating a shape that is substantially parallel to the local gravity field. The epoxy is allowed to cure chemically, as where a hardener is used, or may be cured photonically by directing a suitable wavelength of light onto the epoxy. Where the contact angle θ of the epoxy used is suitably small, the subregion is useable without further modification other than polishing or perhaps cleaning. Where the contact angle is relatively higher, the edge of the epoxy that forms the subregion may be discontinuous with the remainder of the surface of the base 12. In this case, a light grinding may be used to ease this transition so that the chuck 14 may move smoothly thereover.

CONCLUSION

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A stage for supporting a substrate comprising:
   a base positioned below an optical system, the base including a surface having flatness and a size that is at least a size of a field of view of the optical system; and
   a chuck having a lower surface disposed on the base and an upper surface for securing the substrate below the optical system, wherein the chuck includes material having elasticity that substantially conforms to the surface of the base, so that the chuck has substantially the flatness of the base in the field of view of the optical system to provide the substrate within a depth of field of the optical system.

2. The stage of claim 1, wherein the flatness has deviations that are less than 1 millimeter over 1 meter.

3. The stage of claim 1, wherein the flatness is over a subregion of the base.

4. The stage of claim 3, wherein the subregion is proud of a surrounding surface of the base.

5. The stage of claim 3, wherein the subregion is below a surrounding surface of the base.

6. The stage of claim 1, wherein an upper surface of the chuck includes a damping mechanism for securing the substrate in dose conformity with the chuck.

7. The stage of claim 1, wherein the flatness is at least within 2 microns over 200 mm.

8. The stage of claim 1, wherein the base is comprised of at least one monolith with an upper surface of a tile.

9. The stage of claim 1, wherein the base is comprised of at least one monolith with an upper surface of epoxy.

10. The stage of claim 1, wherein the chuck conforms to a geometry of the base while moving relative to the base.

11. The stage of claim 1, wherein the optical system is a projection camera that provides lithographic exposure of the substrate.

12. The stage of claim 1, wherein the optical system is an optical inspection device to inspect the substrate.

13. A system for substrate processing comprising:
    an optical system; and
    a stage comprising
    a base positioned below the optical system, the base including a surface having a flatness and a size that is at least a size of a field of view of the optical system; and
    an elastic chuck, having a lower surface disposed on the base and an upper surface for securing the substrate below the optical system, wherein the elastic chuck includes material having elasticity to substantially conform to the surface of the base matching the flatness of the base in the field of view of the optical system to provide the substrate within a depth of field of the optical system.

14. The system of claim 13, wherein the flatness has deviations that are less than 1 millimeter over 1 meter.

15. The system of claim 13, wherein the flatness is at least within 2 microns over 200 mm.

16. The system of claim 13, wherein the optical system is a projection camera that provides lithographic exposure of a substrate.

17. A method comprising:
    providing a chuck, having a lower surface disposed on a base and an upper surface for securing a substrate below a projection camera, having elasticity with a flatness over the base;
    conforming the chuck to the base with the flatness and a size that is at least a size of a field of view of a projection camera;
    moving the chuck relative to the base to process different parts of a substrate; and
    processing the substrate over the base that provides the flatness for the processing.

18. The method of claim 17, wherein the flatness has deviations that are less than 1 millimeter over 1 meter.

19. The method of claim 17, wherein the flatness is at least within 2 microns over 200 mm.

20. The method of claim 17, wherein the base is comprised of at least one monolith with an upper surface of epoxy.

21. The system of claim 13, wherein the base has two subregions with respective diameters and the flatness is over one of the two subregions with each subregion being associated with a respective projection camera of the optical system.

22. The stage of claim 13, wherein a spacing between the two subregions is at least ten times an average of the diameters of the two subregions.

23. The system of claim 1, wherein the base has two subregions with respective diameters and the flatness is over one of the two subregions with each subregion being associated with a respective projection camera of the optical system.

24. The stage of claim 23, wherein a spacing between the two subregions is at least ten times an average of the diameters of the two subregions.

25. The method of claim 17, wherein the base has two subregions with respective diameters and the flatness is over one of the two subregions with each subregion being associated with a respective projection camera of the optical system.

26. The method of claim 25, wherein a spacing between the two subregions is at least ten times an average of the diameters of the two subregions.

27. The system of claim 13, wherein the flatness is over a subregion of the base.

28. The method of claim 17, wherein the flatness is over a subregion of the base.

* * * * *